Oct. 12, 1965 E. B. FRYSINGER 3,211,926

MONOSTABLE MULTIVIBRATOR WITH VARIABLE PULSE WIDTH

Filed April 24, 1963

INVENTOR.
EDWARD B. FRYSINGER,
BY
Paul M. Coble
ATTORNEY.

United States Patent Office 3,211,926

Patented Oct. 12, 1965

3,211,926

MONOSTABLE MULTIVIBRATOR WITH VARIABLE PULSE WIDTH

Edward B. Frysinger, Manhattan Beach, Calif., assignor to Hughes Aircraft Company, Culver City, Calif., a corporation of Delaware Filed Apr. 24, 1963, Ser. No. 275,368

9 Claims. (Cl. 307—88.5)

Figure 1:
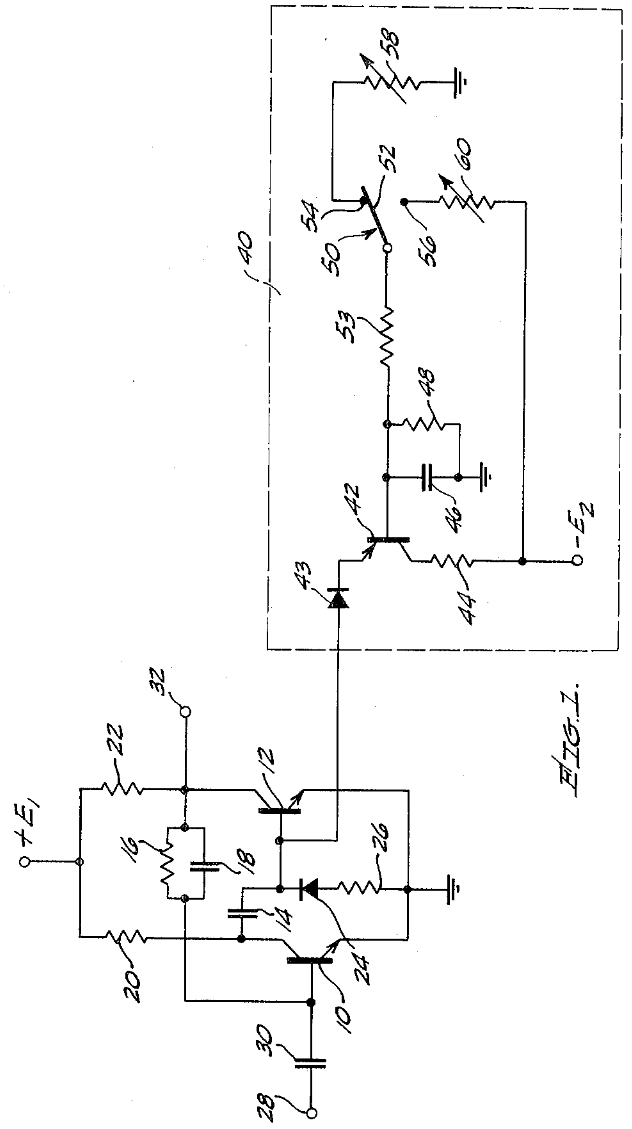

The present invention relates to pulse generation, and more particularly relates to a monostable multivibrator for generating pulses of a duration which may be varied in accordance with a predetermined control program.

In certain applications of pulse generators, such as driving a high power microwave modulator with a transistor multivibrator, stringent power requirements exist during the turn-on and turn-off of the modulator. More specifically, it is often necessary to prevent excessive supply voltage transients during the turn-on and turn-off in order to avoid an abrupt change in power drain from the primary power supply. This requirement can be met if, during turn-on, the multivibrator output pulse width is gradually increased on a pulse-to-pulse basis from zero to its steady state value without changing the amplitude of the pulses, and similarly during turn-off, the multivibrator pulse width is gradually decreased while maintaining the same pulse amplitude.

In vacuum tube multivibrators the foregoing type of variation in output pulse duration could be readily achieved by switching an R.C. network having a relatively large time constant onto the grid circuit of one of the multivibrator vacuum tubes. The required large R.C. time constant is furnished by using a large resistance and a relatively small capacitance. However, when this approach is attempted with transistor multivibrators, the impedances involved are sufficiently low so as to require prohibitively large values of capacitance in order to obtain the proper time constant, making the R.C. time constant technique impractical.

A further problem involved in the design of circuits of the foregoing nature is that of isolating the multivibrating portion of the circuit from the R.C. control portion in order to prevent the immediate cessation of output pulses when the charged capacitor is connected to the multivibrating circuitry.

Accordingly, it is an object of the present invention to provide a transistor multivibrator circuit having simple and reliable control circuitry for varying the duration of the multivibrator output pulses, and which control circuitry not only employs practical values of capacitance, but in addition, achieves the desired isolation from the multivibrating portions of the circuit.

It is a further object of the present invention to provide a pulse generator with a network which furnishes independent pulse-shrink and pulse-expand control so that the duration of the output pulses from the pulse generator may be gradually increased at a desired rate during turn-on and gradually decreased at either the same or a different desired rate during turn-off of the generator.

It is a still further object of the present invention to provide a transistor monostable multivibrator circuit having means for readily varying the duration of the multivibrator output pulses in accordance with a predetermined control program while maintaining an essentially constant pulse amplitude.

In accordance with the foregoing objects, the multivibrator circuit of the present invention includes first and second signal amplifying semiconductor devices, such as transistors, interconnected so that the circuit can exist in a first electrical state in which the first device is conductive of current and the second device is nonconductive of current and, in response an input trigger signal, assumes a second electrical state in which the first device is nonconductive of current and the second device is conductive of current for an interval of time during which an output pulse is provided and after which the circuit reverts to its first electrical state. A controllable impedance device, such as a transistor, is coupled into the circuit to vary the time during which the circuit is in its second electrical state in accordance with a predetermined control program. First and second control signals may be selectively applied to the controllable impedance device to respectively increase its impedance whereby the duration of the multivibrator output pulse is increased on a gradual basis and to decrease its impedance whereby the duration of the output pulse is gradually decreased.

Figure 2:
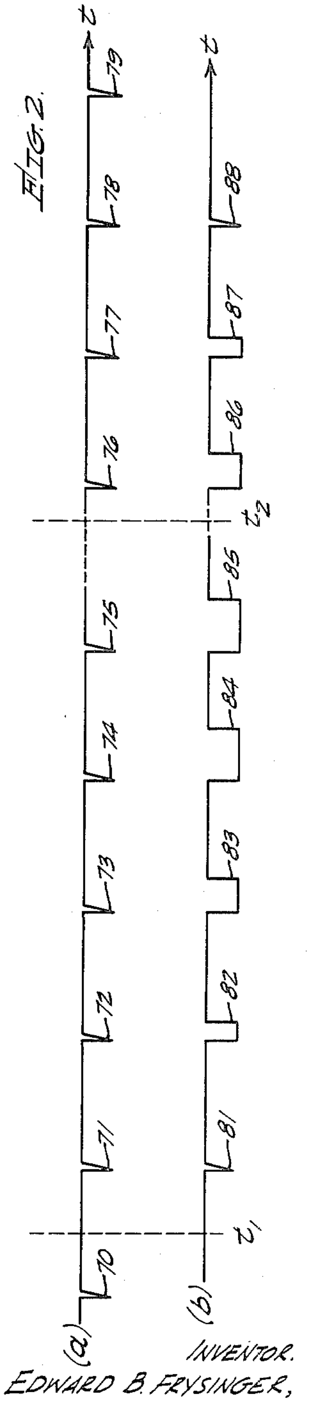

Other objects in addition to those specifically mentioned above, along with characteristic features and advantages of the present invention, will be readily apparent from the following detailed description of a preferred embodiment of the invention when taken in conjunction with the accompanying drawing in which:

FIG. 1 is a schematic circuit diagram illustrating a preferred embodiment of the invention; and FIGS. 2(*a*) and (*b*) are graphs showing voltage waveforms at the input and output, respectively, of the circuit of FIG. 1 which are used in explaining the operation of the circuit.

Referring more particularly to FIG. 1, a monostable multivibrator of the type with which the present invention is concerned may be seen to comprise first and second similar semiconductor amplifying devices 10 and 12, respectively. Although the amplifying devices 10 and 12 are illustrated as NPN transistors, it is to be understood that other semiconductor devices such as PNP transistors may alternately be employed. A regenerative loop is provided by connecting the collector of the first transistor 10 to the base of the second transistor 12 through a capacitor 14, and connecting the collector of the second transistor 12 to the base of the first transistor 10 through a parallel network consisting of a resistor 16 and a capacitor 18. The emitters of the transistors 10 and 12 are connected to a level of reference potential indicated as ground, while the collectors of these transistors are connected through respective resistors 20 and 22 to a terminal supplying a bias potential of $+E_1$. The base of the second transistor 12 is connected to the cathode of a diode 24, with a resistor 26 connected between the anode of the diode 24 and ground. An input terminal 28, adapted to receive trigger pulses, is connected to the base of the transistor 10 through a coupling capacitor 30, while an output terminal 32 is connected to the collector of the transistor 12.

The control circuitry provided by the present invention for varying the duration of the multivibrator output pulses in accordance with a predetermined control program is illustrated within the dashed lines designated by the numeral 40 in FIG. 1. The circuitry 40 includes a semiconductor device 42 having a controllable impedance and which is illustrated as a PNP transistor, although other controllable impedance devices such as NPN transistors could be employed instead. The emitter of the transistor 42 is connected to the base of the transistor 12 via an isolating diode 43 having its anode connected to the base of the transistor 12, while the collector of the transistor 42 is connected by means of a resistor 44 to a terminal supplying a bias potential of $-E_2$. A parallel capacitor 46 and resistor 48 are connected between the base of the transistor 42 and ground.

The condition of the circuitry 40 may be controlled by a switch 50 having a movable contact arm 52 connected to the base of transistor 42 through a resistor 53. The contact arm 52 may be operated manually, or alternately may be energized electrically, for example by a relay. A pair of fixed contacts 54 and 56 are provided for the switch 50, with the contact 54 being connected to ground through a variable resistor 58, while a variable resistor 60 connects the contact 56 with the $-E_2$ bias terminal. As will be explained in more detail below, when the contact arm 52 of the switch 50 is in contact with the terminal 54 the circuitry 40 operates to increase the width of the multivibrator output pulses, and thus the contact 54 is termed the "Expand" contact. On the other hand, the contact 56 is designated as the "Shrink" contact since, when it is in contact with the arm 52, the circuitry 40 functions to decrease the multivibrator pulse width. Varying the resistor 58 varies the overall time constant for the "Pulse-Expand" circuitry, while the resistor 60 may be used to provide an independent control of the "Pulse-Shrink" time.

Operation of the circuit of FIG. 1 will now be discussed with reference to the waveforms of FIG. 2, ignoring for the present the pulse width control circuitry 40. Under quiescent conditions (the stable state of the circuit) the transistor 10 is conductive, while the transistor 12 is cut off. The output terminal 32 thus resides at a potential of essentially $+E_1$. When a negative trigger pulse, such as the pulse 70 of FIG. 2(*a*), is applied to the input terminal 28 to place the circuit in an unstable state, the base of the transistor 10 is driven negative, thereby cutting off the transistor 10. The voltage at the collector of transistor 10 then rises toward the valve $+E_1$. This potential rise is reflected through the capacitor 14 to the base of the transistor 12, causing the transistor 12 to become conductive. The potential at the collector of the transistor 12 is thus lowered, thereby initiating the output pulse provided at the terminal 32. Charging of the capacitor 14 provides an exponentially decaying drive current to the base of the transistor 12. As long as the base current to the transistor 12 is sufficiently large, the transistor 12 may be maintained conductive, and the resulting lowered potential at its collector is reflected through the parallel combination of the resistor 16 and the capacitor 18 to the base of the transistor 10 to maintain the transistor 10 cut off. However, after the base current to the transistor 12 has decreased sufficiently, the collector-emitter current through the transistor 12 is reduced, causing the potential at the collector of the transistor 12 to rise. This rise in potential is reflected at the base of the transistor 10, rendering the transistor 10 conductive. Conduction of the transistor 10 causes the drive current to the base of the transistor 12 to be reduced still further, cutting off the transistor 12 and causing its collector potential to return to essentially $+E_1$, thereby terminating the output pulse.

The duration of the output pulse is a function of the time constant of the exponentially decaying base drive current to the transistor 12, the longer the time constant, the longer the output pulse duration. By varying the impedance between the base of the transistor 12 and ground in a predetermined manner, the control circuitry 40 is able to vary the time constant of the decay of the drive current to the transistor 12, thereby controlling the width of the output pulses provided at the terminal 32.

In the operation of the circuit including the control circuitry 40, before the circuit is turned on the movable contact arm 52 of the switch 50 is placed in the "Pulse-Shrink" position, i.e., in contact with the switch contact 56. When the circuit is energized, a negative bias from the $-E_2$ supply is applied to the base of the transistor 42. The transistor 42 becomes heavily conductive of current, providing a low impedance path through its collector-emitter. The time constant for the decay of a base current to the transistor 12 is thus made so short that the circuit is unable to sustain any multivibrator action. As may be seen from FIG. 2(*b*), when the circuit is in this condition no output pulse is provided in response to the input trigger pulse 70.

At time $t_1$, when it is desired that the circuit commence generating output pulses of constant amplitude and gradually increasing pulse width so as to avoid an abrupt power drain, the switch 52 is moved to the "Pulse-Expand" position in which the contact arm 52 engages the switch contact 54. In this position discharge paths are effected for charge which has accumulated across the capacitor 46 (negative at the base of the transistor 42) through the resistors 53 and 58, as well as through the resistor 48. As the charge across the capacitor 46 is reduced the bias at the base of the transistor 42 becomes less negative, decreasing the flow of collector-emitter current through the transistor 42 and increasing the impedance of its collector-emitter path. This increases the time constant for the decay of base drive current to the transistor 12 and allows multivibrator action to exist long enough for a short spike 81, FIG. 2(*b*), to be produced at the output terminal 32 in response to the next input trigger pulse 71, FIG. 2(*a*), applied to the terminal 28.

As the capacitor 46 discharges further, the base of the transistor 42 becomes still less negative, further reducing collector-emitter current flow through the transistor 42 and gradually increasing the time constant for the decay of base drive current to the transistor 12. Thus, a longer output pulse 82 is provided in response to the next input trigger pulse 72, with the following output pulse 83 generated in response to the next trigger pulse 73 being of greater duration than the pulse 82. Eventually, when the capacitor 46 has been essentially completely discharged, the transistor 42 becomes cut off, and the time constant for the decay of base drive current to the transistor 12 remains fixed at its maximum value during which time the circuit provides steady state output pulses, illustrated as 84 and 85, of constant duration in response to the respective trigger pulses 74 and 75.

When it is desired to turn the circuit off with a gradual reduction in pulse width so as to again avoid any abrupt supply voltage transients, the switch 50 is returned to the "Pulse-Shrink" position, for example at time $t_2$, by moving the contact arm 52 into engagement with the switch contact 56. The capacitor 46 is thus charged from the $-E_2$ supply through resistors 60 and 53, applying a negative bias of gradually increasing magnitude to the base of the transistor 42. Current flow through the collector-emitter path of the transistor 42 commences and is gradually increased to provide a decreasing impedance between the base and emitter of the transistor 12, thereby reducing the time constant for the decay of base drive current to the transistor 12. Thus, output pulses 86, 87 and 88 of gradually decreasing width are provided in response to the respective trigger pulses 76, 77 and 78. Eventually, when the transistor 42 has become heavily conductive, the base drive current time constant has become so short as to prevent any multivibrator action in response to the trigger pulse 79. The circuit may then be de-energized by disconnecting the power supplies $+E_1$ and $-E_2$ from the circuit.

It will be apparent that by gradually increasing and decreasing the pulse duration while maintaining a constant pulse amplitude during turn-on and turn-off, respectively, the duty cycle of the multivibrator circuit is limited, and excessive transients are prevented. For example, for a multivibrator providing a pulse repetition frequency of 200 kc., a pulse "Shrink-Expand" control according to the present invention has been built to gradually increase or decrease the output pulse duration during a 250 millisecond interval without changing the amplitude of the output pulses.

In the event different "Pulse-Shrink" and "Pulse-Expand" intervals are desired, the resistor 58 may be varied to control the "Pulse-Expand" time without affecting the "Pulse-Shrink" time, whereas variation of the variable resistor 60 affords an independent control of the "Pulse-Shrink" time.

It will be appreciated that the principles of the present invention are not limited to varying the pulse width only during turn-on and turn-off of the multivibrator, but rather numerous other modes of operation and modifications for the control circuitry 40 are possible to vary the duration of the multivibrator output pulses in accordance with almost any desired control program. For example, the switch 50 could be operated electrically as a driven vibrating device with a frequency of vibration which is low compared to the pulse repetition frequency to provide a cyclical variation in multivibrator output pulse width. In addition, the frequency of vibration of the switch contact 52 could be varied in accordance with a control signal to produce a modulated cyclical pulse width variation. Also, the movable contact 52 could be driven directly from a sensing instrument to produce an increase in pulse width in response to a first sensed condition and a decrease in pulse width in response to a different sensed condition. Alternatively, the switch 50 and the charging capacitor 46 could be removed, and control signals could be applied to the base of the transistor 42 from a source of alternating control signals such as a sine wave generator to produce a sinusoidal variation in multivibrator output pulse width. Or, if it is desired that the multivibrator generate output pulses of a fixed duration for a desired interval of time and output pulses of a different duration for the same or a different interval of time, the base of the transistor 42 could be driven by square or other rectangular wave signals.

It is further pointed out that although the circuit shown in FIG. 1 employs NPN transistors in its multivibrating portion and a PNP transistor in its pulse duration control portion, the transistors 10 and 12 could equally well be PNP transistors and the transistor 42 an NPN transistor, in which case the polarity of the voltage sources $E_1$ and $E_2$ and the polarity connection of the diodes 24 and 43 would be reversed from that shown.

Thus, it will be apparent that even though the present invention has been shown and described with reference to a particular embodiment, various changes and modifications obvious to a person skilled in the art to which the invention pertains are within the spirit and scope of the invention as set forth in the appended claims.

What is claimed is:

1. A pulse generator for responding to an input trigger signal to produce an output pulse of variable duration comprising: first and second signal amplifying semiconductor devices, circuit means interconnecting said devices for providing a first electrical state in which said first device is conductive of current and said second device is nonconductive of current and for effecting in response to said trigger signal a second electrical state in which said first device is nonconductive of current and said second device is conductive of current for an interval of time during which said output pulse is provided and after which said pulse generator reverts to said first electrical state, a controllable impedance semi-conductor device having a current path of variable impedance coupled to said circuit means and having a control electrode, and means for applying a control signal to said control electrode to vary the impedance of said current path, whereby the duration of said output pulse is varied.

2. A pulse generator for responding to an input trigger signal to reproduce an output pulse of variable duration comprising: first and second signal amplifying semiconductor devices, circuit means interconnecting said devices for providing a first electrical state in which said first device is conductive of current and said second device is nonconductive of current and for effecting in response to said trigger signal a second electrical state in which said first device is nonconductive of current and said second device is conductive of current for an interval of time during which said output pulse is provided and after which said pulse generator reverts to said first electrical state, a controllable impedance semiconductor device having a current path of variable impedance coupled to said second circuit means and having a control electrode, and means for selectively applying first and second control signals to said control electrode to respectively increase the impedance of said current path, whereby the duration of said output pulse is increased, and to decrease the impedance of said current path, whereby the duration of said output pulse is decreased.

3. A multivibrator circuit comprising first and second signal amplifying semiconductor devices each having a first electrode, a second electrode, and a control electrode; said first electrodes being connected together; said second electrodes of said second semiconductor device being coupled to said control electrode of said first semiconductor device; said second electrode of said first semiconductor device being coupled to said control electrode of said second semiconductor device; means for applying a trigger signal to said control electrode of said first semiconductor device; a current path coupled between said first and said control electrodes of said second semiconductor device; said current path including the emitter-collector path of a transistor; and means for applying a control signal to the base electrode of said transistor to vary the current flow through said emitter-collector path independently of said trigger signal and in accordance with a predetermined control program.

4. A pulse generator for responding to an input trigger signal to produce an output pulse of controllable duration comprising: first and second signal amplifying semiconductor devices each having a first electrode, a second electrode and a control electrode; said first electrodes being connected together; said second electrode of said second semiconductor device being coupled to said control electrode of said first semiconductor device; timing means coupled to said second electrode of said first semiconductor device and to said control electrode of said second semiconductor device for providing in response to said trigger signal a time delay during which said output pulse occurs; said timing means including a transistor having its emitter-collector path coupled to said control electrode of said second semiconductor device; and means for applying a control signal to the base electrode of said transistor to vary the impedance of said emitter-collector path and hence vary said time delay in a predetermined manner, whereby the duration of said output pulse is varied.

5. A multivibrator circuit comprising: first and second signal amplifying semiconductor devices each having a first electrode, a second electrode, and a control electrode; said first electrodes being connected together; said second electrode of said second semiconductor device being coupled to said control electrode of said first semiconductor device; and said second electrode of said first semiconductor device being coupled to said control electrode of said second semiconductor device; first impedance means coupled between said first and said control electrodes of said second semiconductor device; a controllable impedance semiconductor device having a first electrode, a second electrode, and a control electrode; said first and second electrodes of said controllable impedance semiconductor device being coupled into said circuit in a manner to form a current path of variable impedance between said control and first electrodes of said second signal amplifying semiconductor device; and means for applying a predetermined control signal to said control electrode of said controllable impedance semiconductor device to vary the impedance between its first and second electrodes.

6. A pulse generator for providing a series of output pulses in response to respective trigger pulses and in which the output pulse duration may be selectively increased or decreased gradually comprising: first and second signal amplifying semiconductor devices each having a first electrode, a second electrode, and a control electrode; said first electrodes being connected together; said second electrode of said second semiconductor device being coupled to said control electrode of said first semiconductor device; said second electrode of said first semiconductor device being coupled to said control electrode of said second semiconductor device; first impedance means coupled between said first and said control electrodes of said second semiconductor device; a controllable impedance semiconductor device having a first electrode, a second electrode, and a control electrode; said first and second electrodes of said controllable impedance semiconductor device being coupled into said circuit in a manner to form a current path of variable impedance between said control and first electrodes of said second signal amplifying device; and switch means for selectively providing a first bias condition in which a bias varying at a rate slow compared to the frequency of repetition of said output pulses is applied to said control electrode of said controllable impedance semiconductor device to gradually increase its impedance, whereby the duration of said output pulses is increased, and a second bias condition in which a bias varying at a rate slow compared to the frequency of repetition of said output pulses is applied to said control electrode of said controllable impedance semiconductor device to gradually decrease its impedance, whereby the duration of said output pulses is decreased.

7. A pulse generator for providing a series of output pulses in response to respective trigger pulses and in which the output pulse duration may be selectively increased or decreased gradually comprising: first and second signal amplifying semiconductor devices each having a first electrode, a second electrode, and a control electrode; said first electrodes being connected together; said second electrode of said second semiconductor device being coupled to said control electrode of said first semiconductor device; said second electrode of said first semiconductor device being coupled to said control electrode of said second semiconductor device; first impedance means coupled between said first and said control electrodes of said second semiconductor device; a controllable impedance semiconductor device having a first electrode, a second electrode, and a control electrode; said first and second electrodes of said controllable impedance semiconductor device being coupled into said circuit in a manner to form a current path of variable impedance between said control and first electrodes of said second signal amplifying device; timing means coupled to said control electrode of said controllable impedance semiconductor device; switch means movable to a first position in which said timing means is energized to provide a bias which varies at a first rate slow compared to the frequency of repetition of said output pulses to said control electrode of said controllable impedance semiconductor device to gradually increase the current flow through said controllable impedance device whereby the duration of said output pulses is decreased and a second position in which said timing means is deenergized to remove said bias from said control electrode of said controllable impedance device at a second rate slow compared to the frequency of repetition of said output pulses to gradually decrease the current flow through said controllable impedance device whereby the duration of said output pulses is increased, and means for independently adjusting said first and said second rates.

8. A pulse generator for responding to an input trigger signal to produce an output pulse of controllable duration comprising: first and second transistors of the same conductivity type, each having a first electrode, a second electrode, and a control electrode; said first electrodes of said first and second transistors being connected to a common conductive element; first impedance means connected between said second electrode of said second transistor and said control electrode of said first transistor; a capacitor connected between said second electrode of said first transistor and said control electrode of said second transistor; bias means having a first, a second, and a third terminal with said first terminal connected to said conductive element; second impedance means connected between said second terminal and said second electrode of said first transistor; third impedance means connected between said second terminal and said second electrode of said second transistor; input means connected to said control electrode of said first transistor; output means connected to said second electrode of said second transistor; fourth impedance means connected between said first and said control electrodes of said second transistor; a third transistor of a conductivity type complementary to that of said first and second transistors and having a first electrode, a second electrode, and a control electrode; said first electrode of said third transistor being coupled to said control electrode of said second transistor; fifth impedance means connected between said second electrode of said third transistor and said third terminal of said bias means; sixth impedance means connected between said control electrode of said third transistor and said conductive element; a switch having a movable contact and first and second fixed contacts; seventh impedance means connected between said control electrode of said thirid transistor and said movable contact; eighth impedance means connected between said first fixed contact and said third terminal of said bias means; and ninth impedance means connected between said second fixed contact and said conductive element.

9. A pulse generator for responding to an input trigger signal to produce an output pulse of controllable duration comprising: first and second transistors of the same conductivity type, each having an emitter electrode, a base electrode, and a collector electrode; the emitter electrodes of said first and second transistors being connected to a common conductive element; a first resistor and a first capacitor connected in parallel between the collector electrode of said second transistor and the base electrode of said first transistor; a second capacitor connected between the collector electrode of said first transistor and the base electrode of said second transistor; a first source of bias potential having one terminal connected to said conductive element and having another terminal; a second resistor connected between said another terminal and the collector electrode of said first transistor; a third resistor connected between said another terminal and the collector electrode of said second transistor; input means connected to the base electrode of said first transistor; output means connected to the collector electrode of said second transistor; a first diode and a fourth resistor connected in series between the base and emitter electrodes of said second transistor; a third transistor of a conductivity type complementary to that of said first and second transistors and having an emitter electrode, a base electrode, and a collector electrode; a second diode connected between the emitter electrode of said third transistor and the base electrode of said second transistor; a second source of bias potential having one terminal connected to said conductive element and having a second terminal; a fifth resistor connected between the collector electrode of said third transistor and said second terminal; a sixth resistor and a third capacitor connected in parallel between the base electrode of said third transistor and said conductive element; a switch having a movable contact and first and second fixed contacts; a seventh resistor connected between the base electrode of said third transistor and said movable contact; an eighth resistor connected between said first fixed contact and said second terminal of said second source of bias potential; and a ninth resistor connected between said second fixed contact and said conductive element.

References Cited by the Examiner

UNITED STATES PATENTS 2,945,966 7/60 Davenport ----------- 307—88.5

FOREIGN PATENTS 1,009,873 6/52 France.

JOHN W. HUCKERT, *Primary Examiner.*